United States Patent
Yen et al.

(10) Patent No.: US 9,905,897 B2
(45) Date of Patent: Feb. 27, 2018

(54) DEVICE FOR BLOCKING HIGH FREQUENCY SIGNAL AND PASSING LOW FREQUENCY SIGNAL

(71) Applicant: Taiwan Semiconductor Manufacturing CO., LTD., Hsinchu (TW)

(72) Inventors: Hsiao-Tsung Yen, Tainan (TW); Cheng-Wei Luo, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/455,530

(22) Filed: Mar. 10, 2017

(65) Prior Publication Data

US 2017/0187344 A1 Jun. 29, 2017

Related U.S. Application Data (63) Continuation of application No. 14/178,697, filed on Feb. 12, 2014, now Pat. No. 9,628,041.

(51) Int. Cl.
*H01P 1/20* (2006.01)
*H01P 1/203* (2006.01)
*H01P 3/08* (2006.01)

(52) U.S. Cl.
CPC ............ *H01P 1/2007* (2013.01); *H01P 1/203* (2013.01); *H01P 3/081* (2013.01)

(58) Field of Classification Search
CPC ................. H01F 17/0006; H01F 37/00; H01F 2017/0073; H01P 3/081; H01P 1/2007; H01P 1/203; H03H 7/0123; H03H 7/0138

USPC ....... 333/175, 181, 182, 185, 236, 238, 245, 333/246

See application file for complete search history.

(56) References Cited

U.S. PATENT DOCUMENTS

| | | | |
|---|---|---|---|
| 3,904,994 A * | 9/1975 | Bates | H01J 23/24 315/3.5 |
| 5,495,217 A | 2/1996 | Garcia | |
| 5,995,817 A | 11/1999 | Lubbe | |
| 6,624,729 B2 * | 9/2003 | Wright | H01P 3/081 333/238 |
| 8,355,688 B2 | 1/2013 | Rofougaran | |
| 9,628,041 B2 * | 4/2017 | Yen | H03H 7/0123 |
| 2008/0051157 A1 | 2/2008 | Kim | |
| 2010/0237967 A1 | 9/2010 | Ueno | |

FOREIGN PATENT DOCUMENTS

| | | |
|---|---|---|
| EP | 0828308 | 8/2004 |
| JP | S59144204 A | 8/1984 |
| TW | 200941937 | 10/2009 |
| TW | 200941938 | 10/2009 |

* cited by examiner

*Primary Examiner* — Benny Lee
*Assistant Examiner* — Jorge Salazar, Jr.

(57) ABSTRACT

A device includes a transmission plate, a conductive plate, a first capacitive unit, and electrodes. The transmission plate is configured to be electrically coupled between an input source and a load. The conductive plate includes a winding structure and is configured to be electrically coupled to ground. The first capacitive unit is electrically coupled between the conductive plate and the transmission plate. The electrodes are interdigitated with the winding structure of the conductive plate.

20 Claims, 10 Drawing Sheets

DEVICE FOR BLOCKING HIGH FREQUENCY SIGNAL AND PASSING LOW FREQUENCY SIGNAL

CROSS-REFERENCE TO RELATED APPLICATION

This application is a continuation of U.S. application Ser. No. 14/178,697, filed on Feb. 12, 2014, now U.S. Pat No. 9,628,041 B2, issued on Apr. 18, 2017, which are incorporated herein by reference in their entireties.

BACKGROUND

In electronics, a choke is commonly used to block alternating-current (AC) signals with frequencies higher than a desired value, while direct-current (DC) signals or low frequency signals are allowed to pass.

In some approaches, when the choke is applied in an electronic device, the choke is useful for eliminating radio frequency (RF) noise from lines and for preventing electromagnetic interference (EMI) and radio frequency interference (RFI) from power supply lines.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

A choke usually consists of a coil, and therefore is occasionally called an inductor. Since a coil is composed of a core on which wire is wound, size of a choke is hard to be decreased. With the progression of technology, sizes of electronic devices are required to be reduced. However, when electronic devices utilize such choke, the sizes of the electronic devices are difficult to be reduced.

Figure 1:
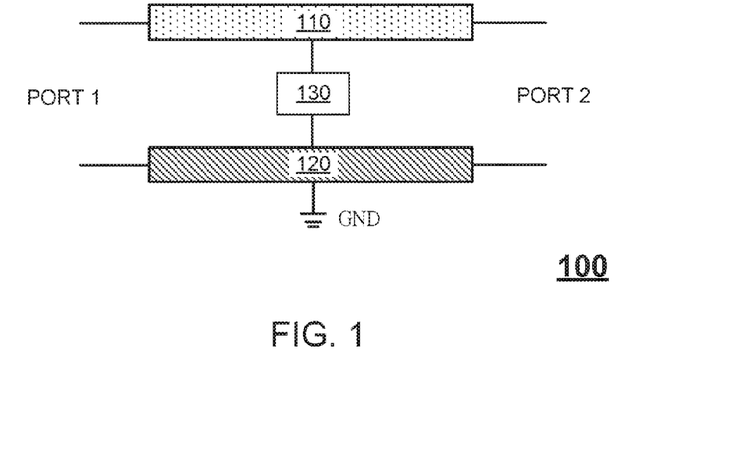
FIG. 1 is a schematic diagram of a device in accordance with various embodiments of the present disclosure.

For possessing the property of such choke while reducing the sizes of the electronic devices, a device 100 is provided and illustrated in FIG. 1.

As shown in FIG. 1, the device 100 includes a transmission plate 110, a conductive plate 120, and a capacitive unit 130. The conductive plate 120 is configured to be electrically coupled to ground GND. The capacitive unit 130 is electrically coupled between the transmission plate 110 and the conductive plate 120. As illustrated in FIG. 1, connections among the transmission plate 110, the conductive plate 120, and the capacitive unit 130 form two ports, i.e., port 1 and port 2. Moreover, the transmission plate 110 is configured to be electrically coupled to an input source (not shown) via port 1 and electrically coupled to a load (not shown) via port 2.

As illustrated in FIG. 1, the capacitive unit 130 is electrically coupled between the middle of the transmission plate 110 and the middle of the conductive plate 120. The configuration and location of the capacitive unit 130 in FIG. 1 is given for illustrative purposes. Various configurations and locations of the capacitive unit 130 are within the contemplated scope of the present disclosure. Explained in a different way, the capacitive unit 130 is able to be electrically coupled between any portion of the transmission plate 110 and any portion of the conductive plate 120 according to practical needs.

Figure 2:
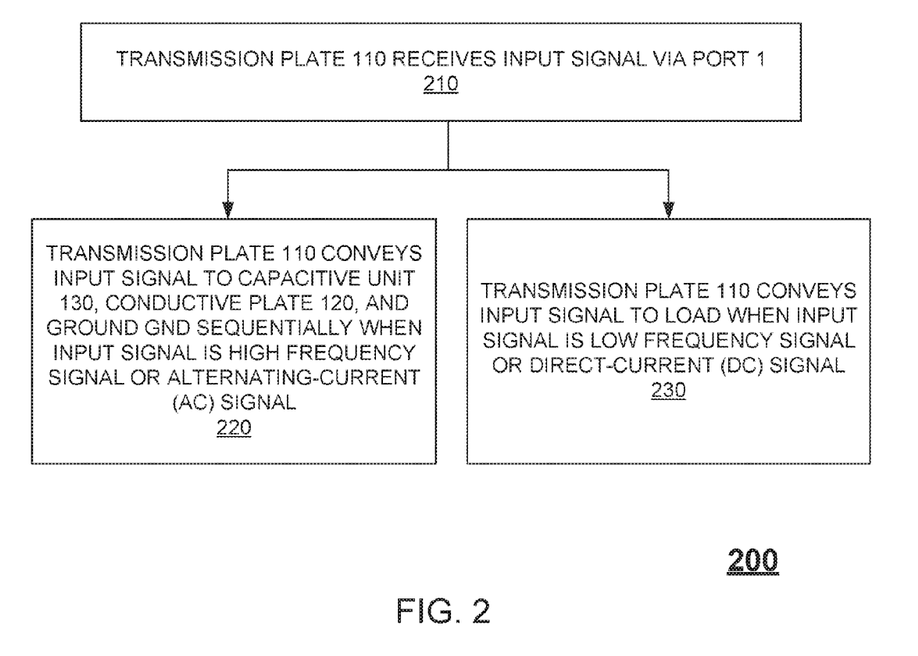
FIG. 2 is a flow chart of a method illustrating operations of the device in FIG. 1, in accordance with various embodiments of the present disclosure.

FIG. 2 is a flow chart of a method 200 illustrating operations of the device 100 in FIG. 1, in accordance with various embodiments of the present disclosure. For illustration, the operations of the device 100 in FIG. 1 are described with reference to the method 200.

In operation 210, the transmission plate 110 receives an input signal via port 1.

In operation 220, the transmission plate 110 conveys the input signal to the capacitive unit 130, the conductive plate 120, and the ground GND sequentially when the input signal is a high frequency signal or an alternating-current (AC) signal. Explained in a different way, the device 100 blocks high frequency signals or AC signals by conveying the high frequency signals or AC signals to ground GND.

In operation 230, the transmission plate 110 conveys the input signal to a load (not shown) when the input signal is a low frequency signal or a direct-current (DC) signal. Explained in a different way, the device 100 passes low frequency signals or DC signals to the load.

Based on the operations 220 and 230, the capacitive unit 130 together with the conductive plate 120 and the transmission plate 110 operate as a choke. Moreover, compared with a choke employing an inductor, the size of the device 100 is smaller. As a result, if electronic devices employ the device 100 which operates as a choke, the sizes of the electronic devices are reduced, and the portability of the electronic devices is therefore increased.

Figure 3:
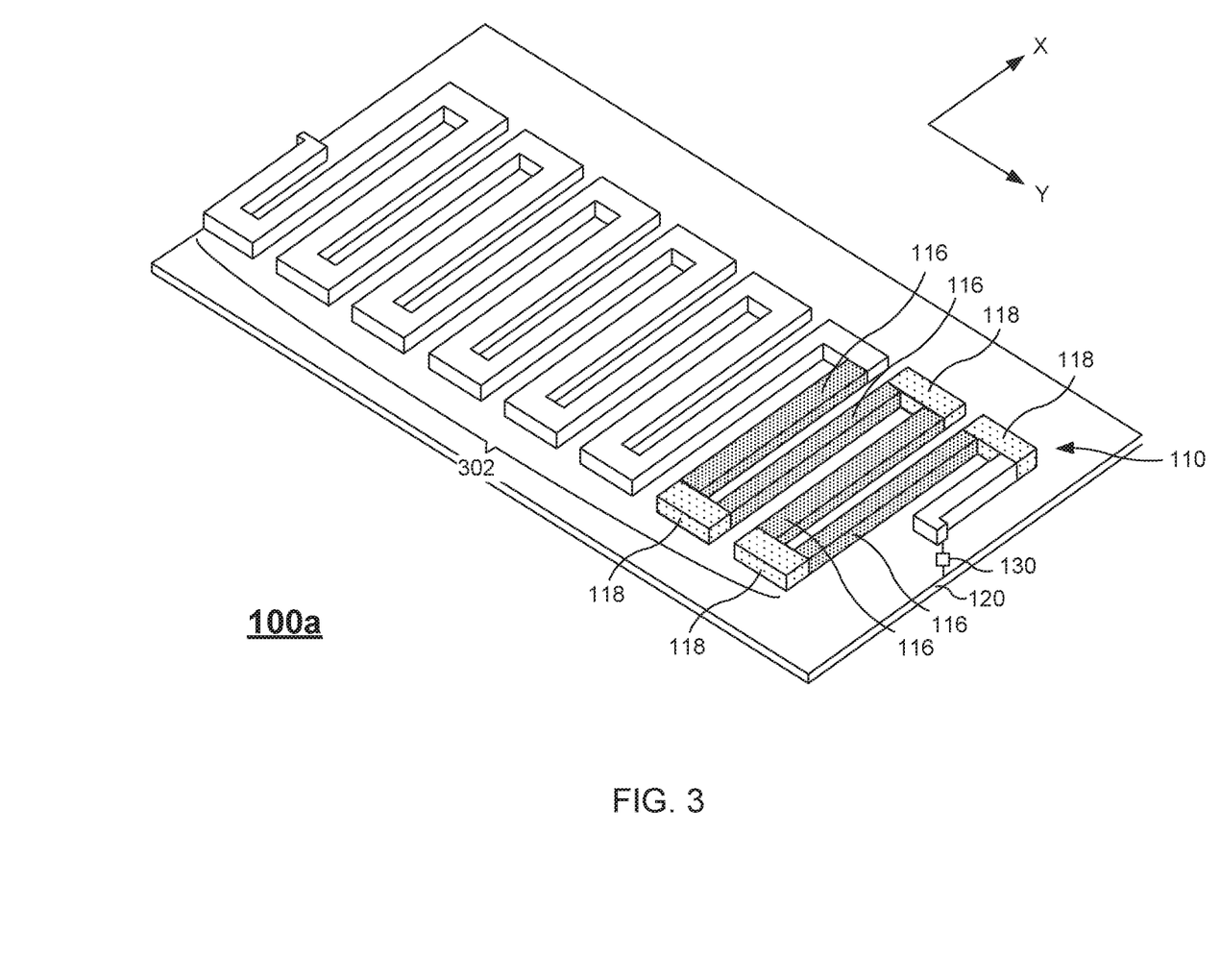
FIG. 3 is a schematic diagram of a device in accordance with various embodiments of the present disclosure.

FIG. 3 is a schematic diagram of a device 100a in accordance with various embodiments of the present disclosure. As illustrated in FIG. 3, the transmission plate 110 of the device 100a includes a winding structure 302. The capacitive unit 130 is electrically coupled between the winding structure 302 and the conductive plate 120. The winding structure 302 has impedance and is configured to prevent high frequency signals from being passed therethrough. As a result, the function of the device 100a for blocking high frequency signals is further enhanced.

Figure 4:
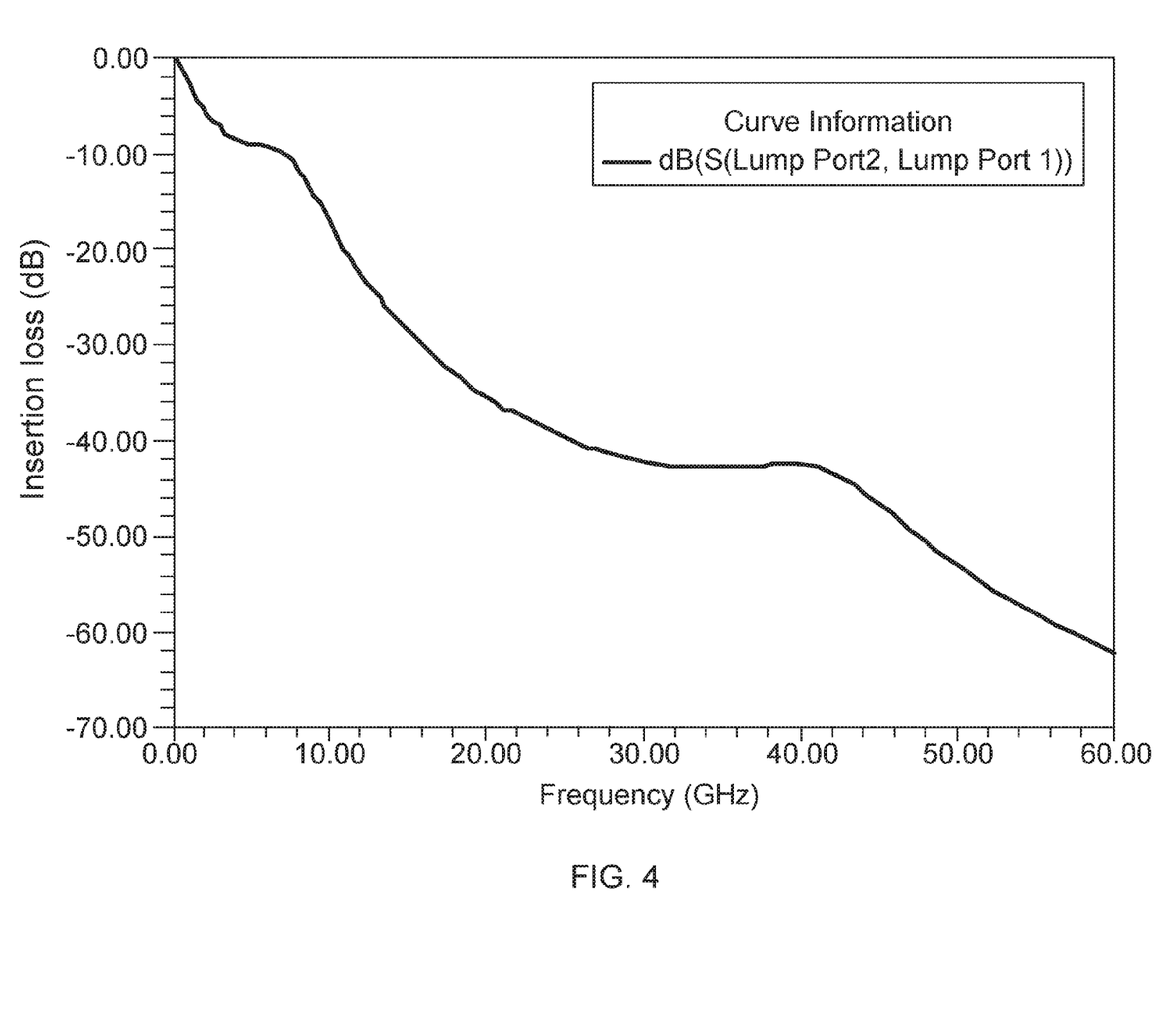
FIG. 4 is a graph of waveforms illustrating insertion loss of an input signal which passes through the device in FIG. 3, in accordance with various embodiments of the present disclosure.

FIG. 4 is a graph of waveforms illustrating insertion loss of an input signal which passes through the device 100a in FIG. 3, in accordance with various embodiments of the present disclosure. When signals pass through a device, power of the signals is usually lost in the device. Such power loss is indicated as insertion loss. If a value of insertion loss of an input signal is below about −7 dB, this represents that a great deal of power of the input signal is lost in the device. Explained in different way, the device is able to block the input signal. In addition, when the insertion loss of the input signal is decreased, the blocking capability of the device is enhanced.

For illustration in FIG. 4, in a condition of the input signal having a frequency range of about 3 GHz to about 60 GHz, the value of the insertion loss is lower than about −7 dB. Accordingly, the device 100a is able to block signals having the frequency range of about 3 GHz to about 60 GHz. The frequency range of about 3 GHz to about 60 GHz is broader, compared with the frequency range in some approaches employing the choke composed of coil(s).

Figure 5:
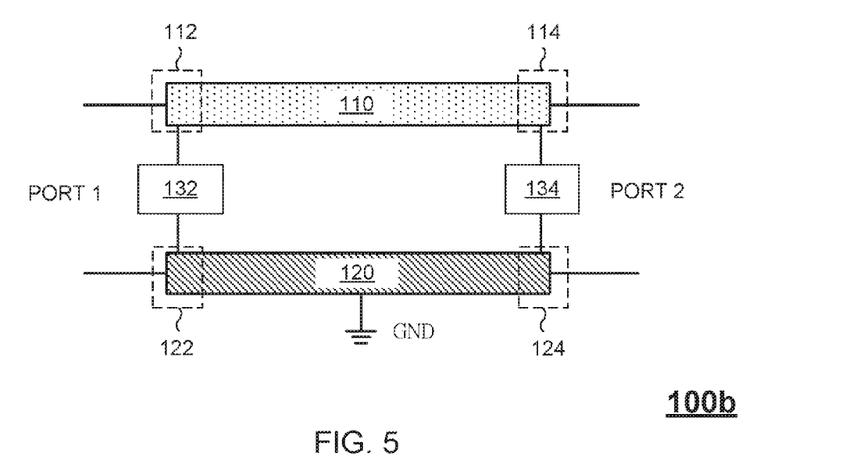
FIG. 5 is a schematic diagram of a device in accordance with various embodiments of the present disclosure.

FIG. 5 is a schematic diagram of a device 100b in accordance with various embodiments of the present disclosure. Compared with the device 100 in FIG. 1, the device 100b in FIG. 5 includes two capacitive units 132, 134. As illustrated in FIG. 5, the transmission plate 110 includes an input terminal 112 and an output terminal 114, and the conductive plate 120 includes an input terminal 122 and an output terminal 124. The capacitive unit 132 is electrically coupled between the input terminal 112 of the transmission plate 110 and the input terminal 122 of the conductive plate 120. The capacitive unit 134 is electrically coupled between the output terminal 114 of the transmission plate 110 and the output terminal 124 of the conductive plate 120.

Figure 6:
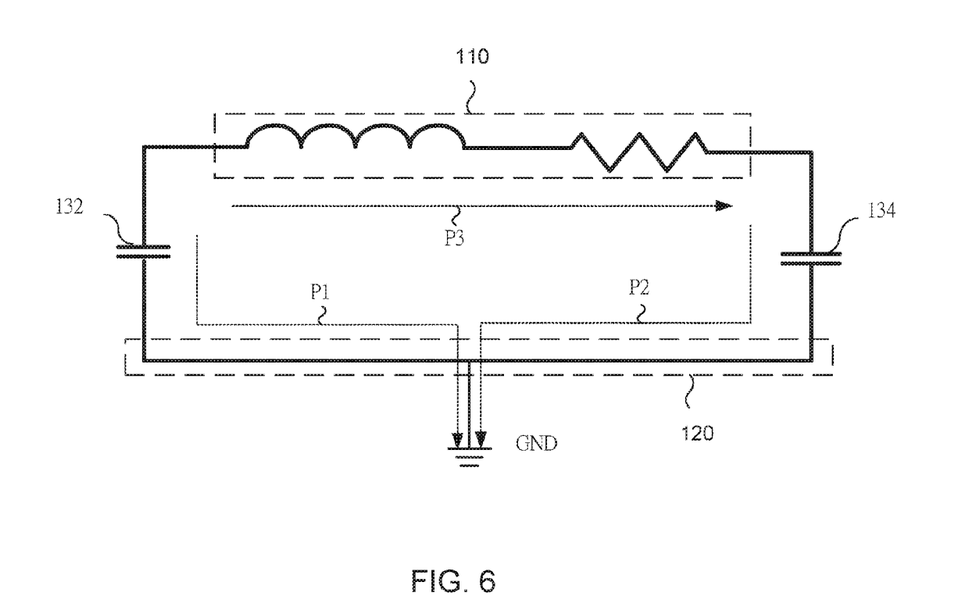
FIG. 6 is an equivalent circuit of the device as illustrated in FIG. 5 in accordance with various embodiments of the present disclosure.

FIG. 6 is an equivalent circuit of the device 100b as illustrated in FIG. 5, in accordance with various embodiments of the present disclosure. In some embodiments, the transmission plate 110 includes a winding structure, and thus its equivalent circuit in FIG. 6 includes impedance components, such as an inductor and/or a resistor.

For illustration in FIG. 6, there are paths P1, P2, and P3 for the input signals to pass, and operations thereof are described below.

In various operations, the transmission plate 110 receives an input signal via port 1. In further operations, the transmission plate 110 conveys the input signal from the input terminal 112 of the transmission plate 110 to the capacitive unit 132, the input terminal 122 of the conductive plate 120, and the ground GND sequentially when the input signal is a high frequency signal or an AC signal. Explained in a different way, the transmission plate 110 conveys the input signal through the path P1.

In various operations, the transmission plate 110 conveys the input signal from the output terminal 114 of the transmission plate 110 to the capacitive unit 134, the output terminal 124 of the conductive plate 120, and the ground GND sequentially when the input signal is a high frequency signal or an AC signal. Explained in a different way, the transmission plate 110 conveys the input signal through the path P2.

In further operations, the transmission plate 110 conveys the input signal to the load when the input signal is a low frequency signal or a DC signal. Explained in a different way, the transmission plate 110 conveys the input signal to pass through the path P3.

Figure 7:
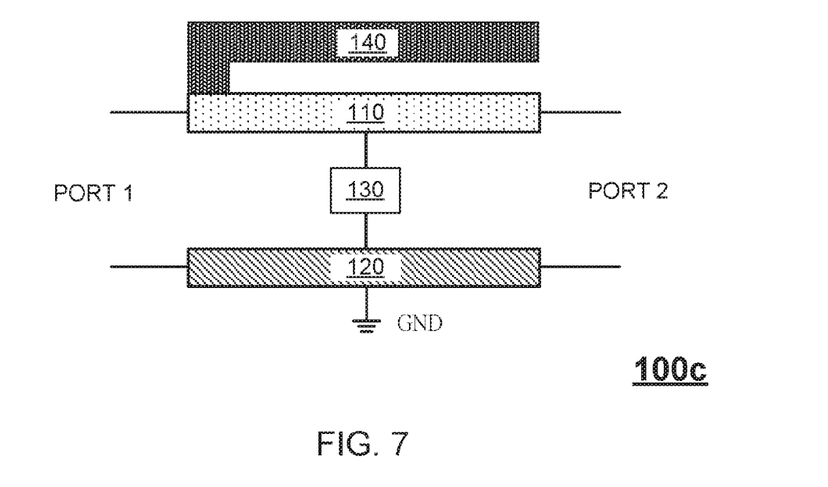
FIG. 7 is a schematic diagram of a device in accordance with various embodiments of the present disclosure.

FIG. 7 is a schematic diagram of a device 100c in accordance with various embodiments of the present disclosure. Compared with the device 100 in FIG. 1, the device 100c in FIG. 7 further includes a conducting wire 140. In some embodiments, the conducting wire 140 is an open stub. One terminal of the conducting wire 140 is disposed on the transmission plate 110, and another terminal of the conducting wire 140 is not connected to any device. Explained in a different way, the conducting wire 140 together with the transmission plate 110 form an open loop. Accordingly, the conducting wire 140 is operable to provide impedance. Consequently, the device 100c blocks high frequency signals from being outputted via port 2.

Figure 8:
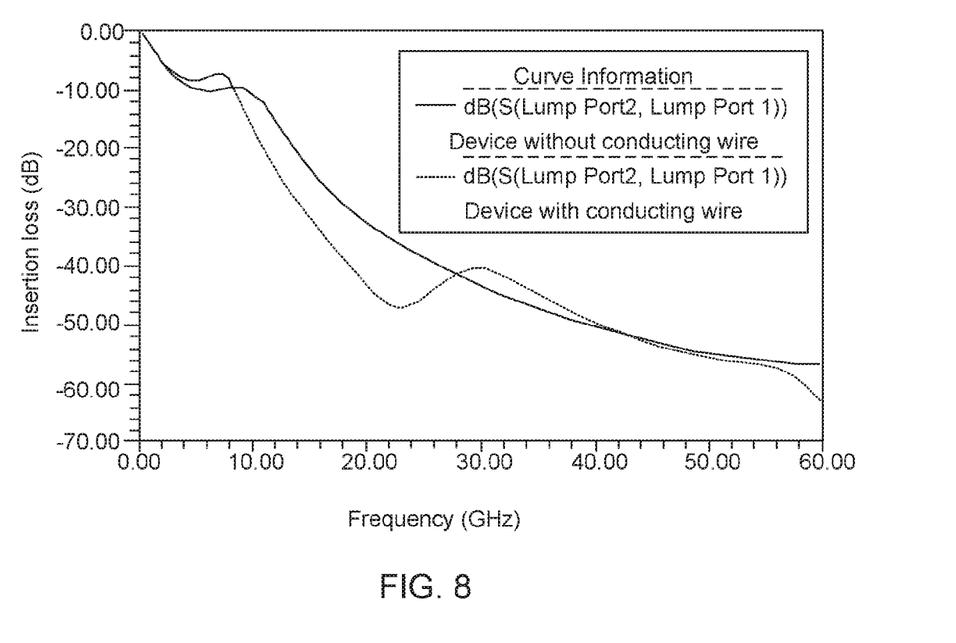
FIG. 8 is a graph of waveforms illustrating insertion losses of input signals which pass through the devices in FIG. 1 and FIG. 7, in accordance with various embodiments of the present disclosure.

FIG. 8 is a graph of waveforms illustrating insertion losses of input signals which pass through the devices in FIG. 1 and FIG. 7, in accordance with various embodiments of the present disclosure. As shown in FIG. 8, if a range of the frequency of the input signal is about 8 GHz to about 28 GHz, the insertion loss of the device 100c is lower than the insertion loss of the device 100. As a result, the blocking capability of the device 100c is better than that of the device 100 in such frequency range of the input signals.

Figure 9A:
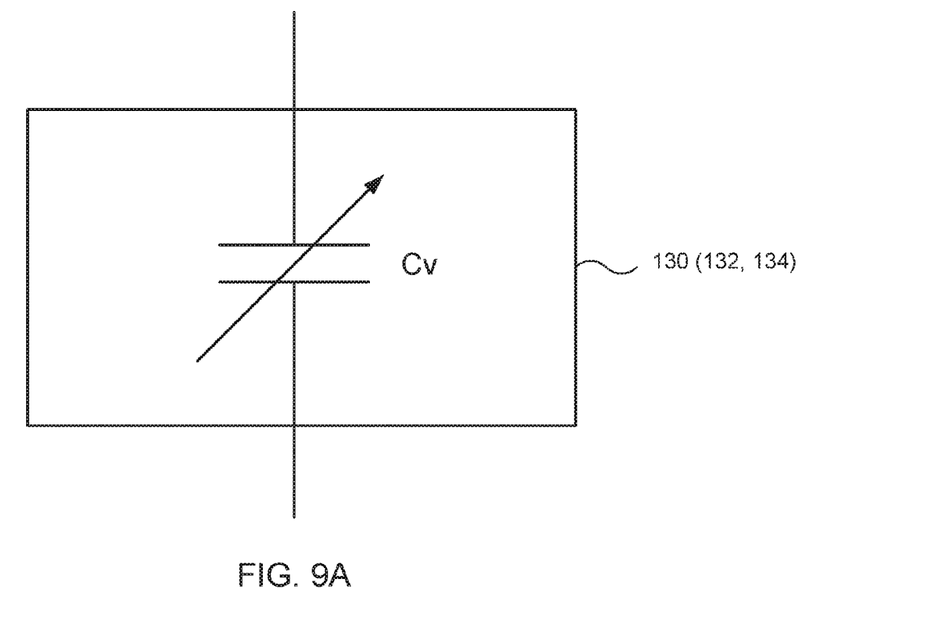
FIG. 9A is a schematic diagram of a capacitive unit of a device in accordance with various embodiments of the present disclosure.
Figure 9B:
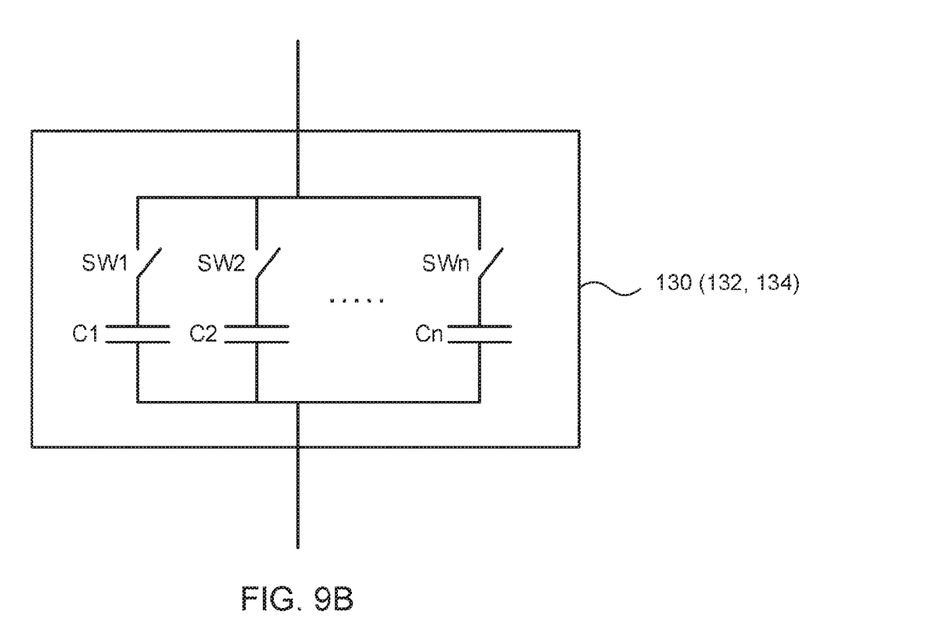
FIG. 9B is a schematic diagram of a capacitive unit of a device in accordance with various embodiments of the present disclosure.

In some embodiments, at least one of the aforementioned capacitive units 130, 132, 134 includes a varactor Cv, as illustrated in FIG. 9A. In some other embodiments, at least one of the aforementioned capacitive units 130, 132, 134 includes capacitors C1, C2, . . . , Cn and switches SW1, SW2, . . . , SWn, as illustrated in FIG. 9B. As illustrated in FIG. 9B, the capacitors C1, C2, . . . , Cn are coupled to the switches SW1, SW2, . . . , SWn, respectively, in parallel. As a result, the capacitance of the capacitive unit 130 in FIG. 1 and FIG. 7 or the capacitive units 132 and 134 in FIG. 5 is adjustable. In some embodiments, the switches SW1, SW2, . . . , SWn are configured to receive control signals. The switches SW1, SW2, . . . , SWn are controlled by the control signals for adjusting a capacitance of the capacitive unit 130, 132, 134. The embodiments illustrated in FIGS. 9A and 9B are given for illustrative purposes. Various configurations of the capacitive unit are within the contemplated scope of the present disclosure.

In various embodiments, the above-mentioned capacitive units 130, 132, 134 include a metal insulator metal capacitor (MIMCAP), a metal oxide metal capacitor (MOMCAP), a metal oxide semiconductor capacitor (MOSCAP), and a finger capacitor. The aforementioned capacitors are given for illustrative purposes. Various types of capacitors are within the contemplated scope of the present disclosure.

With reference to FIG. 3, in some embodiments, the winding structure includes sticks 116 and sticks 118. The sticks 116 are disposed in a first direction X, and the sticks 118 are disposed in a second direction Y perpendicular to the first direction X. As illustrated in FIG. 3, the sticks 116 and the sticks 118 are coupled to each other to form the winding structure. The winding structure in FIG. 3 is given for illustrative purposes. Various configurations of the winding structure are within the contemplated scope of the present disclosure.

Figure 10:
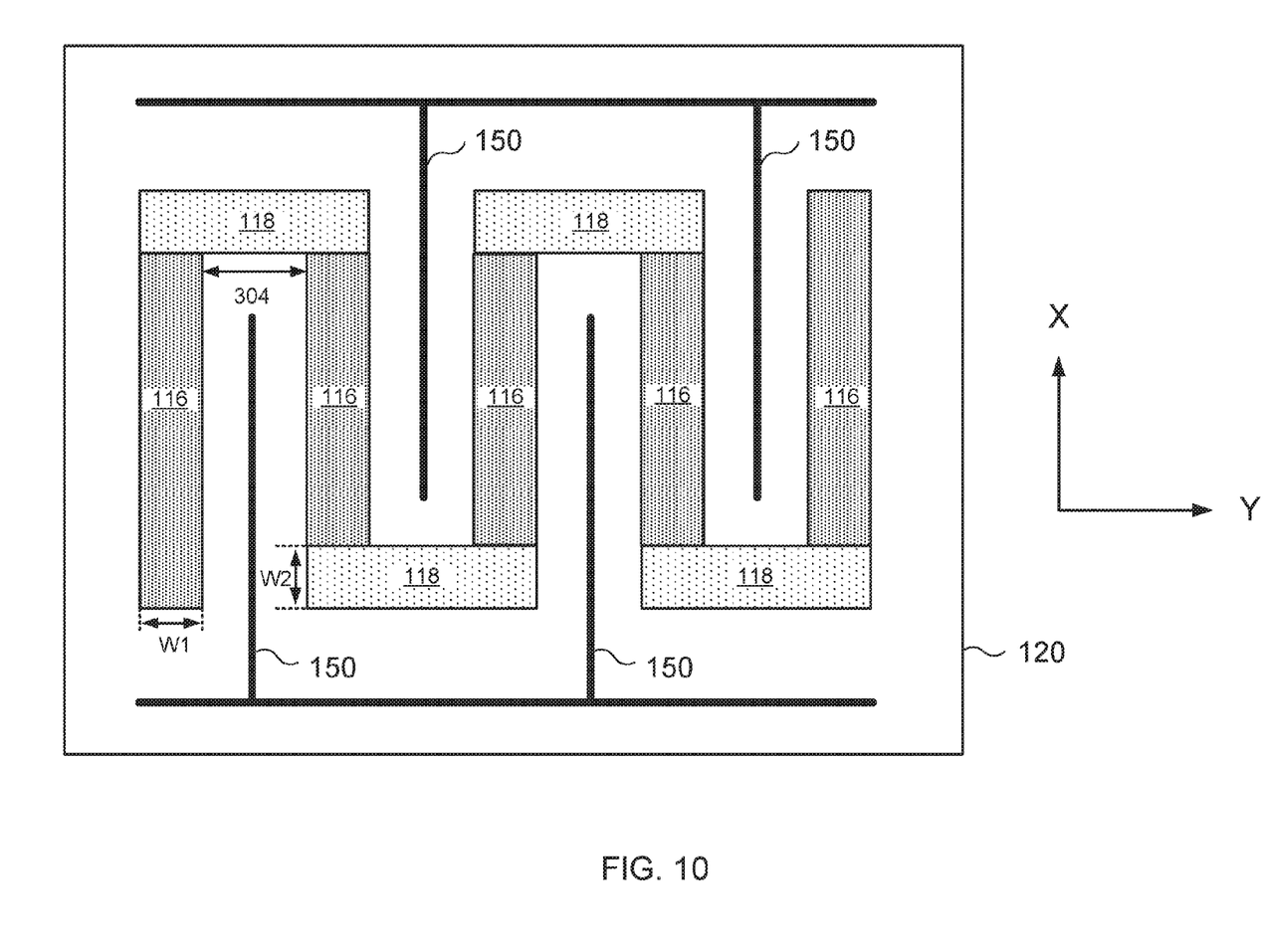
FIG. 10 is a top view of the device as illustrated in FIG. 3 in accordance with various embodiments of the present disclosure.

FIG. 10 is a top view of the device 100a as illustrated in FIG. 3 in accordance with various embodiments of the present disclosure. As shown in FIG. 10, there is a spacing 304 between two adjacent sticks 116. A width of the stick 116 is labeled as W1, and a width of the stick 118 is labeled as W2. In some embodiments, a range of the width of the stick 116 is from about 0.5 um to about 30 um, a range of the width of the stick 118 is from about 0.5 um to about 30 um, and a range of the spacing is from about 0.5 um to about 30 um.

In some embodiments, each of the ranges of widths of the sticks 116, the sticks 118, and the spacing 304 is from about 1 um to about 10 um. In further embodiments, each of the ranges of widths of the sticks 116, the sticks 118, and the spacing 304 is from about 2 um to about 6 um. If the widths of the stick 116, the stick 118, and the spacing 304 are within the foregoing ranges, the blocking capability of the device 100a is better. The ranges of the widths of the sticks 116, the sticks 118, and the spacing 304 are given for illustrative purposes. Various ranges of widths of the sticks 116, the sticks 118, and the spacing 304 are within the contemplated scope of the present disclosure.

Is some embodiments, with respect to FIG. 10, the device 100a as illustrated in FIG. 10 further includes a plurality of electrodes 150, in which each of the electrodes 150 is disposed between two adjacent sticks 116. In the condition that electricity is provided to the electrodes 150, the winding structure 302 and the electrodes 150 become a conductor, thereby facilitating low frequency signals or DC signals to pass through the device 100a.

Figure 11:
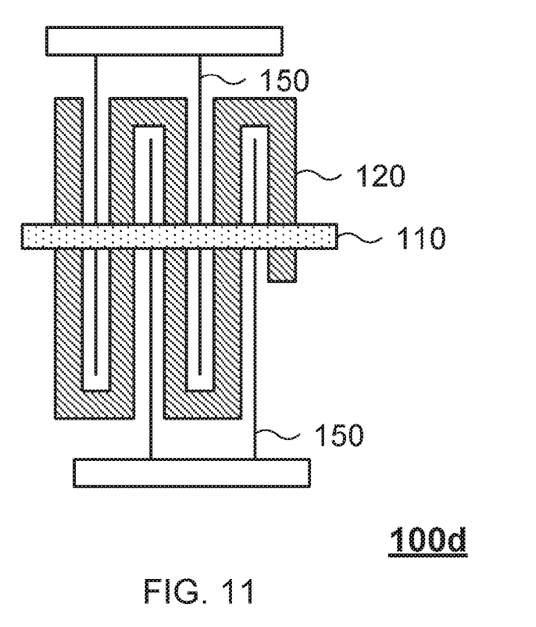
FIG. 11 is a schematic diagram of a device in accordance with various embodiments of the present disclosure.

FIG. 11 is a schematic diagram of a device 100d in accordance with various embodiments of the present disclosure. As shown in FIG. 11, the conductive plate 120 includes a winding structure. Similar to the device 100a in FIG. 10, each of the electrodes 150 in FIG. 11 is disposed between two adjacent sticks of the winding structure of the conductive plate 120.

Figure 12:
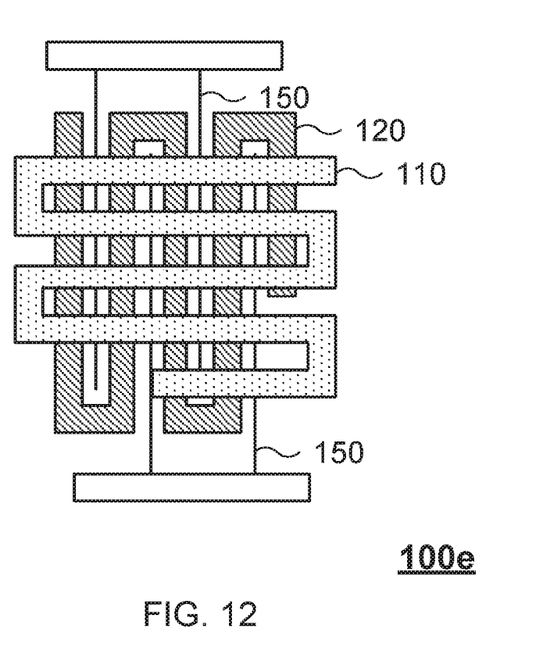
FIG. 12 is a schematic diagram of a device in accordance with various embodiments of the present disclosure.

FIG. 12 is a schematic diagram of a device 100e in accordance with various embodiments of the present disclosure. As shown in FIG. 12, each of the transmission plate 110 and the conductive plate 120 includes a winding structure. For illustration, the winding structure of the transmission plate 110 is disposed in perpendicular to that of the conductive plate 120. Similar to the device 100a in FIG. 10, each of the electrodes 150 in FIG. 12 is disposed between two adjacent sticks of the winding structure of the conductive plate 120. In some embodiments, the electrodes 150 are disposed between two adjacent sticks of the winding structure of the transmission plate 110.

Figure 13:
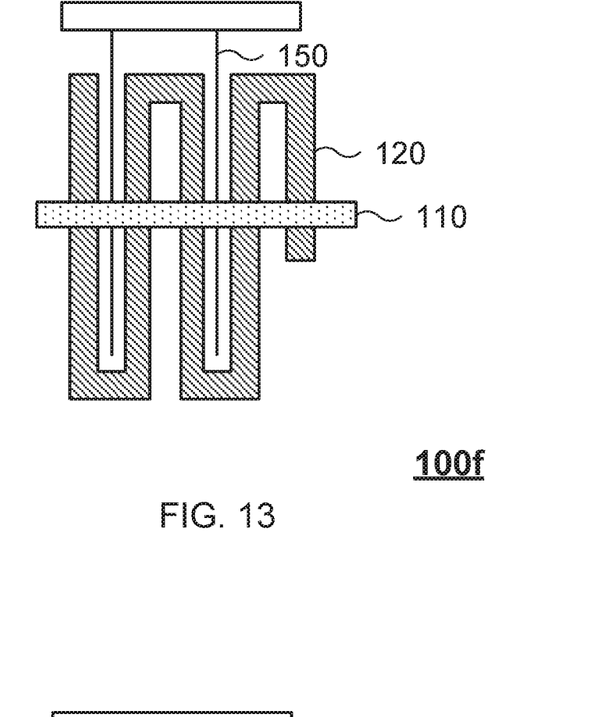
FIG. 13 is a schematic diagram of a device in accordance with various embodiments of the present disclosure.

FIG. 13 is a schematic diagram of a device 100f in accordance with various embodiments of the present disclosure. As shown in FIG. 13, the conductive plate 120 includes a winding structure. Compared with the device 100d in FIG. 11, the electrodes 150 in FIG. 13 are partially disposed between two adjacent sticks of the winding structure of the conductive plate 120.

Figure 14:
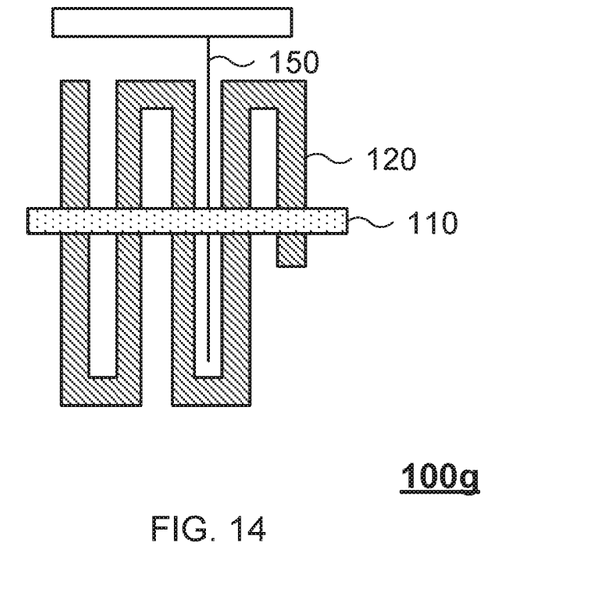
FIG. 14 is a schematic diagram of a device in accordance with various embodiments of the present disclosure.

FIG. 14 is a schematic diagram of a device 100g in accordance with various embodiments of the present disclosure. As shown in FIG. 14, the conductive plate 120 includes a winding structure. Compared with the device 100f in FIG. 13, the electrodes 150 disposed between two adjacent sticks of the winding structure of the conductive plate 120 are fewer.

Figure 15:
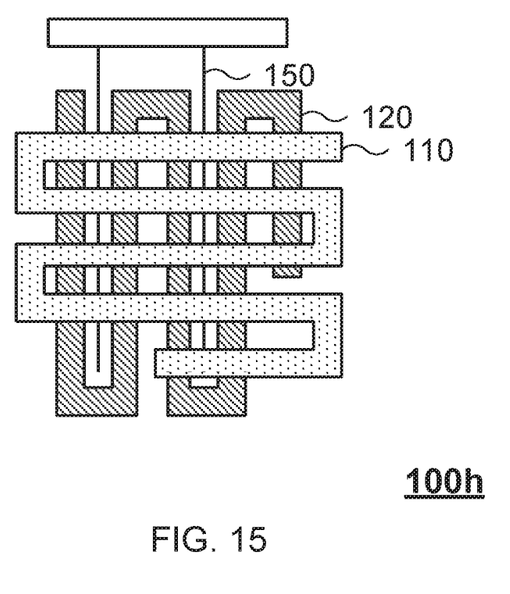
FIG. 15 is a schematic diagram of a device in accordance with various embodiments of the present disclosure.

FIG. 15 is a schematic diagram of a device 100h in accordance with various embodiments of the present disclosure. As shown in FIG. 15, each of the transmission plate 110 and the conductive plate 120 includes a winding structure. Compared with the device 100e in FIG. 12, the electrodes 150 in FIG. 15 are partially disposed between two adjacent sticks of the winding structure of the conductive plate 120. In various embodiments, the electrodes 150 are partially disposed between two adjacent sticks of the winding structure of the transmission plate 110.

In some embodiments, a device is disclosed that includes a transmission plate, a conductive plate, a first capacitive unit, and electrodes. The transmission plate is configured to be electrically coupled between an input source and a load. The conductive plate includes a winding structure and is configured to be electrically coupled to ground. The first capacitive unit is electrically coupled between the conductive plate and the transmission plate. The electrodes are interdigitated with the winding structure of the conductive plate.

Also disclosed is a device including a transmission plate, a conductive plate, a capacitive unit, and electrodes. The transmission plate is configured to receive an input signal. The conductive plate includes a winding structure and is configured to be electrically coupled to ground. The capacitive unit is electrically coupled between the transmission plate and the conductive plate. The transmission plate is configured to convey the input signal to the capacitive unit, the conductive plate, and the ground sequentially on condition that the input signal is an AC signal, and the transmission plate is configured to convey the input signal to a load on condition that the input signal is a DC signal. The electrodes are interdigitated with the winding structure of the conductive plate.

Also disclosed is a method includes operations outlined below. An input signal is received. The input signal is conveyed to ground via a transmission plate, a capacitive unit, and a conductive plate that has a winding structure, on condition that the input signal is an AC signal. The input signal is conveyed to a load via the transmission plate on condition that the input signal is a DC signal, in response to a plurality of electrodes interdigitated with the winding structure of the conductive plate and provided with electricity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:
    a transmission plate configured to be electrically coupled between an input source and a load;
    a conductive plate comprising a winding structure and configured to be electrically coupled to ground;
    a first capacitive unit electrically coupled between the conductive plate and the transmission plate; and
    a plurality of electrodes interdigitated with the winding structure of the conductive plate.

2. The device of claim 1, wherein the transmission plate comprises an input terminal, the conductive plate comprises an input terminal, the first capacitive unit is electrically coupled between the input terminal of the transmission plate and the input terminal of the conductive plate.

3. The device of claim 2, further comprising:
    a second capacitive unit electrically coupled between the conductive plate and the transmission plate,
    wherein the transmission plate further comprises an output terminal, the conductive plate further comprises an output terminal, and the second capacitive unit is electrically coupled between the output terminal of the transmission plate and the output terminal of the conductive plate.

4. The device of claim 1, wherein the winding structure comprises:
    a plurality of first sticks disposed in a first direction;
    a plurality of second sticks disposed in a second direction perpendicular to the first direction, wherein the plurality of first sticks and the plurality of second sticks are coupled to each other to form the winding structure.

5. The device of claim 4, wherein each electrode of the plurality of electrodes is disposed between two adjacent first sticks of the plurality of first sticks.

6. The device of claim 4, wherein the plurality of electrodes are fewer than the plurality of second sticks.

7. The device of claim 4, wherein the plurality of electrodes are disposed in parallel to each other.

8. The device of claim 4, wherein the plurality of electrodes are disposed in the first direction.

9. The device of claim 1, wherein the transmission plate comprises a winding structure.

10. The device of claim 9, wherein the winding structure of the transmission plate is disposed perpendicular to the winding structure of the conductive plate.

11. The device of claim 1, wherein the plurality of electrodes comprise:
    a plurality of first electrodes disposed at a first side of the winding structure; and
    a plurality of second electrodes disposed at a second side of the winding structure.

12. The device of claim 1, further comprising:
    a conducting wire disposed on the transmission plate,
    wherein a first terminal of the conducting wire is electrically coupled to the transmission plate, and a second terminal of the conducting wire is disconnected from the transmission plate.

13. A device, comprising:
    a transmission plate configured to receive an input signal;
    a conductive plate comprising a winding structure and configured to be electrically coupled to ground;
    a capacitive unit electrically coupled between the transmission plate and the conductive plate,
    wherein the transmission plate is configured to convey the input signal to the capacitive unit, the conductive plate, and the ground sequentially on condition that the input signal is an AC signal, and the transmission plate is configured to convey the input signal to a load on condition that the input signal is a DC signal; and
    a plurality of electrodes interdigitated with the winding structure of the conductive plate.

14. The device of claim 13, wherein the conductive plate comprises an input terminal and an output terminal, and the transmission plate comprises an input terminal and an output terminal,
    wherein the transmission plate is configured to convey the input signal from the input terminal of the transmission plate to the capacitive unit, the input terminal of the conductive plate, the conductive plate, and the ground sequentially if the input signal is the AC signal,
    or to convey the input signal from the output terminal of the transmission plate to the capacitive unit, the output terminal of the conductive plate, the conductive plate, and the ground sequentially on condition that the input signal is the AC signal.

15. The device of claim 13, wherein the plurality of electrodes comprise:
    a plurality of first electrodes disposed at a first side of the winding structure; and
    a plurality of second electrodes disposed at a second side of the winding structure.

16. The device of claim 13, wherein the transmission plate comprises a winding structure, and the winding structure of the transmission plate is disposed perpendicular to the winding structure of the conductive plate.

17. A method, comprising:
    receiving an input signal;
    conveying the input signal to ground via a transmission plate, a capacitive unit, and a conductive plate that has a winding structure, on condition that the input signal is an AC signal; and
    conveying the input signal to a load via the transmission plate on condition that the input signal is a DC signal, in response to electricity being applied to a plurality of electrodes which are interdigitated with the winding structure of the conductive plate.

18. The method of claim 17, wherein conveying the input signal to the ground comprises:
    conveying the input signal from an input terminal of the transmission plate to the capacitive unit, an input terminal of the conductive plate, the winding structure of the conductive plate, and the ground sequentially on condition that the input signal is the AC signal.

19. The method of claim 17, wherein conveying the input signal to the ground comprises:
    conveying the input signal from an output terminal of the transmission plate to the capacitive unit, an output terminal of the conductive plate, the winding structure of the conductive plate, and the ground sequentially on condition that the input signal is the AC signal.

20. The method of claim 17, wherein the capacitive unit comprises a plurality of circuits, each of the circuits comprises a respective capacitor and a corresponding switch that are coupled in series, and the circuits are coupled to each other in parallel, and the method further comprises:

controlling, by a plurality of control signals, the switches to adjust a capacitance of the capacitive unit.

* * * * *